United States Patent
Cui et al.

(10) Patent No.: US 11,209,709 B2
(45) Date of Patent: Dec. 28, 2021

(54) DISPLAY SUBSTRATE AND MANUFACTURING METHOD THEREOF, DISPLAY PANEL AND DISPLAY DEVICE

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Xiaochen Cui, Beijing (CN); Peng Li, Beijing (CN); Jungho Park, Beijing (CN); Jaikwang Kim, Beijing (CN); Zhe Li, Beijing (CN); Xiaoji Li, Beijing (CN); Dongxing Zhao, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 785 days.

(21) Appl. No.: 16/068,297

(22) PCT Filed: Dec. 1, 2017

(86) PCT No.: PCT/CN2017/114294
§ 371 (c)(1),
(2) Date: Jul. 5, 2018

(87) PCT Pub. No.: WO2018/205569
PCT Pub. Date: Nov. 15, 2018

(65) Prior Publication Data
US 2021/0191211 A1    Jun. 24, 2021

(30) Foreign Application Priority Data
May 10, 2017   (CN) .......................... 201710327060.8

(51) Int. Cl.
G02F 1/1362    (2006.01)
H01L 27/12     (2006.01)
G02F 1/1333    (2006.01)

(52) U.S. Cl.
CPC .. *G02F 1/136295* (2021.01); *G02F 1/133345* (2013.01); *H01L 27/124* (2013.01); *H01L 27/1248* (2013.01); *H01L 27/1288* (2013.01)

(58) Field of Classification Search
CPC ......... G02F 1/136295; G02F 1/133345; H01L 27/124; H01L 27/1288; H01L 27/1248
See application file for complete search history.

(56) References Cited

U.S. PATENT DOCUMENTS 4,670,097 A * 6/1987 Abdalla .......... H01L 31/022475
                                                    216/13
2008/0023637 A1    1/2008 Cho et al.
2016/0329361 A1* 11/2016 Du ............................ H01L 27/12

FOREIGN PATENT DOCUMENTS

CN    101126848 A    2/2008
CN    101807585 A    8/2010
(Continued)

OTHER PUBLICATIONS

The International Search Report and Written Opinion dated Feb. 24, 2018; PCT/CN2017/114294.

(Continued)

*Primary Examiner* — Kyoung Lee (57) ABSTRACT

A display substrate and a method thereof, a display panel and a display device are provided. The display substrate includes: a base substrate; and at least one first signal line and a first insulating layer which are disposed on the base substrate; a surface of the first insulating layer away from the base substrate and a surface of the at least one first signal line away from the base substrate are parallel with the base substrate and are substantially located in a continuous flat (Continued)

plane. The first insulating layer which is disposed side by side with the first signal line can improve the surface flatness level of the display substrate and prevent the subsequently formed structures on the display substrate suffering from display defectives due to a too large step.

14 Claims, 9 Drawing Sheets

(56) References Cited

FOREIGN PATENT DOCUMENTS

| | | |
|---|---|---|
| CN | 103779202 A | 5/2014 |
| CN | 205591480 U | 9/2016 |
| CN | 107065356 A | 8/2017 |
| GN | 104733477 A | 6/2015 |
| JP | 2007-193200 A | 8/2007 |
| JP | 2011-221116 A | 11/2011 |

OTHER PUBLICATIONS

The Second Chinese Office Action dated Sep. 27, 2018; Appln. No. 201710327060.8.

* cited by examiner

DISPLAY SUBSTRATE AND MANUFACTURING METHOD THEREOF, DISPLAY PANEL AND DISPLAY DEVICE

The application claims priority to the Chinese patent application No. 201710327060.8, filed on May 10, 2017, the entire disclosure of which is incorporated herein by reference as part of the present application.

TECHNICAL FIELD

At least one embodiments of the present disclosure relates to a display substrate and a manufacturing method thereof, a display panel and a display device.

BACKGROUND

As living standards are raised, customers have higher and higher requirements for display products nowadays, especially for the improvement of display quality. However, limited to the conventional processes, the surface flatness level of a display substrate is not high and steps existing in some areas of the surface of the display substrate may cause display defectives such as residual image. As a result, how to improve the surface flatness level of a display substrate is a difficulty confronted by manufacturers.

SUMMARY

At least one embodiment of the present disclosure provides a display substrate, comprising: a base substrate; and at least one first signal line and a first insulating layer, which are disposed on the base substrate; a surface of the first insulating layer away from the base substrate and a surface of the at least one first signal line away from the base substrate are parallel with the base substrate and are substantially located in a continuous flat plane.

For example, the display substrate provided by at least one embodiment of the present disclosure can further comprise a second insulating layer disposed on the base substrate; the second insulating layer covers the first signal line and the first insulating layer.

For example, the display substrate provided by at least one embodiment of the present disclosure can further comprise a first electrode or a semiconductor layer which disposed on a side of the second insulating layer away from the base substrate.

For example, in the display substrate provided by at least one embodiment of the present disclosure, the at least one first signal line comprises at least one or a combination of a gate line, a data line and a common electrode line.

For example, in the display substrate provided by at least one embodiment of the present disclosure, the at least one first signal line is a common electrode line and the first insulating layer is a gate insulating layer.

For example, in the display substrate provided by at least one embodiment of the present disclosure, the display substrate is an array substrate.

At least one embodiment of the present disclosure provides a display panel, comprising any one of the above mentioned display substrates.

At least one embodiment of the present disclosure provides a display device, comprising any one of the above mentioned display panels.

At least one embodiment of the present disclosure provides a manufacturing method of a display substrate, comprising: providing a base substrate; forming at least one first signal line on the base substrate; and forming a first insulating layer on the base substrate and the first insulating layer is disposed side by side with the at least one first signal line. A surface of the first insulating layer away from the base substrate and a surface of the at least one first signal line away from the base substrate are parallel with the base substrate and are substantially located in a continuous flat plane.

For example, in the manufacturing method provided by at least one embodiment of the present disclosure, forming the at least one first signal line on the base substrate comprises: providing a first mask; depositing a conductive layer film on the base substrate and coating a first photoresist layer on the conductive layer film; and exposing the first photoresist layer with the first mask, developing the exposed first photoresist layer to obtain a first photoresist pattern, and patterning the conductive layer film with the first photoresist pattern so as to form the at least one first signal line.

For example, in the manufacturing method provided by at least one embodiment of the present disclosure, forming the first insulating layer on the base substrate and side by side with the at least one first signal line comprises: in a direction perpendicular to the base substrate, depositing a first insulating layer film on the base substrate formed with the at least one first signal line; a thickness of the first insulating layer film is substantially same as a thickness of the at least one first signal line; coating a second photoresist layer on the first insulating layer film; and on a side of the second photoresist layer away from the base substrate, exposing the second photoresist layer with the first mask, developing the exposed second photoresist layer to obtain a second photoresist pattern, and patterning the first insulating layer film with the second photoresist pattern so as to form the first insulating layer.

For example, in the manufacturing method provided by at least one embodiment of the present disclosure, the first photoresist layer is a positive photoresist layer and the second photoresist layer is a negative photoresist layer; or the first photoresist layer is a negative photoresist layer and the second photoresist layer is a positive photoresist layer.

For example, in the manufacturing method provided by at least one embodiment of the present disclosure, forming the first insulating layer on the base substrate and side by side with the at least one first signal line comprises: in a direction perpendicular to the base substrate, depositing a first insulating layer film on the base substrate formed with the at least one first signal line. A thickness of the first insulating layer film is substantially same as a thickness of the at least one first signal line; forming a third photoresist layer on the first gate insulating layer; and on a side of the base substrate away from the at least one signal line, exposing the third photoresist layer by using the at least one signal line as a mask, developing the exposed third photoresist layer to obtain a third photoresist pattern, and patterning the first insulating layer film with the third photoresist pattern so as to form the first insulating layer.

For example, in the manufacturing method provided by at least one embodiment of the present disclosure, the third photoresist layer is a negative photoresist layer.

For example, the manufacturing method provided by at least one embodiment of the present disclosure can further comprise: forming a second insulating layer on the base substrate which is formed with the at least one first signal first line and the first insulating layer; the second insulating layer covers the at least one first signal line and the first insulating layer.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relevant position relationship, and when the position of the object which is described is changed, the relevant position relationship may be changed accordingly.

A signal line disposed in a display substrate may cause a step in the edge of a display area, and the step can cause structures disposed on the display substrate not to be in a same level, and further causes display defective such as residual image. To avoid the step that is too large, the thickness of the signal line is usually restricted in design, which however may cause dysfunctions of the signal line such as too high resistivity and too low strength to be broken and the like; or, a planarization layer needs to be applied to planarize the surface of the display substrate, which may increase the thickness of the display substrate and is not beneficial to reduce the weight and thickness of the display substrate.

Figure 1:
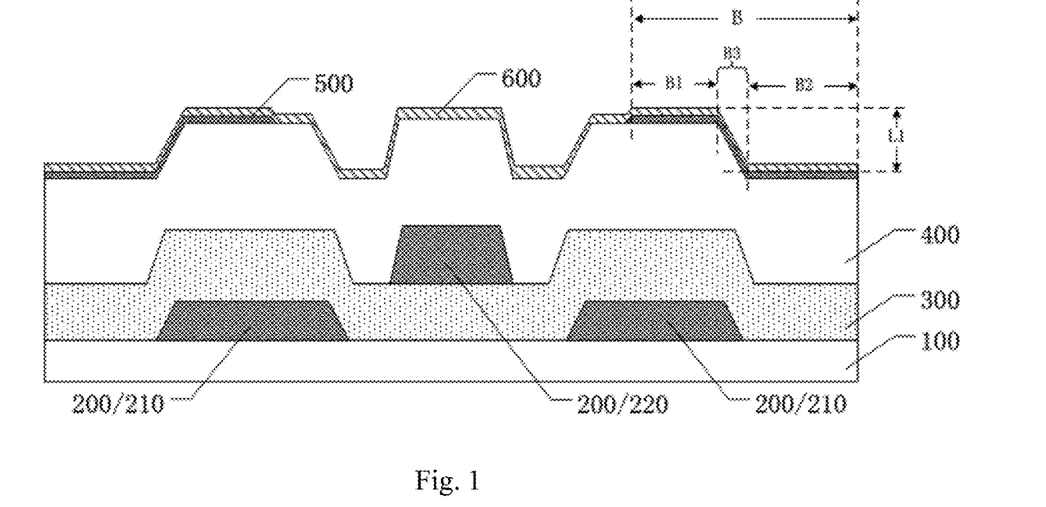
FIG. 1 is a schematically structural diagram of a display substrate.

FIG. 1 is a schematically structural diagram of a display substrate. As illustrated in FIG. 1, a first signal line 210, an insulating layer 300, a second signal line 220, an interlayer dielectric layer 400 and a first electrode 500 are sequentially disposed on a base substrate 100, and the first electrode 500 corresponds to a display ara B of a pixel area. Due to the first signal line 210, a step area B3 exists around the edge of the display area. For example, the display substrate is an array substrate, the first signal line 210 is a gate line, the insulating layer 300 is a gate insulating layer, and the second signal line 220 is a data line.

Taking the case that the display substrate illustrate in FIG. 1 is applied in a liquid crystal display panel for example, an alignment layer 600 needs to be disposed on the surface of the display substrate through an alignment process so as to pre-tilt liquid crystal molecules. However, the alignment layer has different strength and orientation in the step area B3 from in the flat area (not shown in the picture and comprising the area B1 and the area B2), which causes a disordered pre-tilt state of the liquid crystal molecules, and further causes the liquid crystal molecules corresponding to the step area B3 in an unsynchronized operation state with the liquid crystal molecules corresponding to the flat area. Furthermore, within the flat area, a step also exists between the area B1 and the area B2, which results in a thickness difference between the liquid crystal molecules corresponding to the area B1 and the liquid crystal molecules corresponding to the area B2, and also results in a difference in rotation degree between the liquid crystal molecules corresponding to the two areas. When the display substrate is in operation, the liquid crystal molecules corresponding to the step area B3, the area B1 and the area B2 are different in rotation degree. For example, the step area B3, the area B1 and the area B2 cannot reach a dark state synchronously, and display defectives such as residual image and decreased contrast ratio are caused.

It should be noted that display defectives due to the step on the surface of the display substrate are not limited to the above mentioned cases. For example, the display substrate can be an array substrate, and in an actual manufacturing process, a signal line is also formed in addition to forming a thin film transistor. Because the manufacturing process of the thin film transistor is complicated, a step that is too large may increase the number of slopes generated during the formation of the structures of layers of the thin film transistor, for example, increasing parasitic capacitance. For example, during the process of cell-assembling of the array substrate and the opposing substrate to form a display panel, due to the step, the diffusion of liquid crystal molecules is disadvantageously affected, causing faults in the liquid crystal molecules such as bubbles, so a vacuum cell-assembling process and heat treatment in a longer time period are required, resulting in a decreased productivity.

At least one embodiment of the present disclosure provides a display substrate and a manufacturing method thereof, a display panel and a display device, which can eliminate or reduce the step on the display substrate.

At least one embodiment of the present disclosure provides a display substrate comprising: a base substrate; and at least one first signal line and a first insulating layer, which are disposed on the base substrate. A surface of the first insulating layer away from the base substrate and a surface of the at least one first signal line away from the base substrate are parallel with the base substrate and are substantially located in a continuous flat plane. The first insulating layer which is disposed side by side with the first signal line can improve the surface flatness level of the display substrate and prevent the subsequently formed structures on the display substrate suffering from defectives due to a too large step. For example, in embodiments of the present disclosure, the relation between the first signal line and the first insulating layer is described as "matched/matching", and the layer of the display substrate is set to be flat, on which the first signal line and the first insulating layer are disposed.

It should be noted that in embodiments of the present disclosure, signal lines can be provided on the display substrate, and the signal lines can comprise one type of signal lines and also different types of signal lines. In a case that the signal lines comprise different types of signal lines, these signal lines can be disposed in a same layer of the display substrate, or can be disposed in different layers of the display substrate as well. In a case that the signal lines comprise different types of signal lines disposed in different layers, as long as one layer of the different layers is disposed with a first insulating layer, and the surface of the first insulating layer away from the base substrate and the surface of the signal line located in this layer away from the base substrate are parallel with the base substrate and are substantially located in a continuous flat plane, thus the surface flatness level of the display substrate can be improved.

The display substrate and a manufacturing method thereof, a display panel and a display device in at least one embodiment of the present disclosure are described below in combination with figures, taking the case that the first insulating layer is formed in the layer where the at least one signal line is formed to match the signal line for example.

Figure 2:
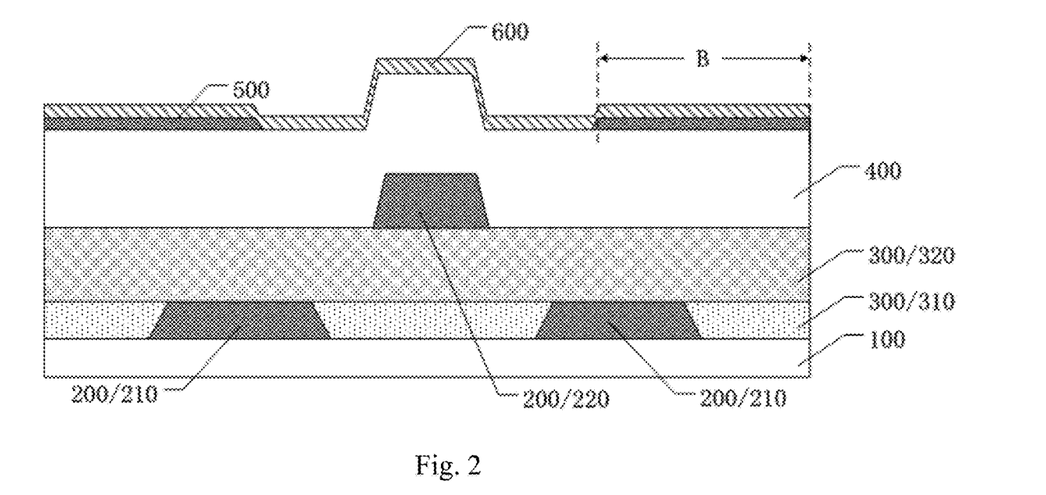
FIG. 2 is a schematically structural diagram of a display substrate provided by an embodiment of the present disclosure.

At least one embodiment of the present disclosure provides a display substrate, and FIG. 2 is a schematically structural diagram of a display substrate provided by an embodiment of the present disclosure. For example, as illustrated in FIG. 2, in an embodiment of the present disclosure, the display substrate can comprise: a base substrate 100, a first signal line 210 and a first insulating layer 310 which are disposed on the base substrate 100. A surface of the first insulating layer 310 away from the base substrate 100 and a surface of the signal line 210 away from the base substrate 100 are substantially located in a continuous flat plane. For example, the surface of the first insulating layer 310 away from the base substrate 100 and the surface of the signal line 210 away from the base substrate 100 can be both parallel with the base substrate 100. For example, in the direction perpendicular to the base substrate 100, the thickness of the first insulating layer 310 and the thickness of the signal line 210 are close to each other or equal to each other. In this way, compared to the display substrate illustrated in FIG. 1, the flatness level of the surface of the substrate, on which the first signal line 210 is disposed, is improved. The detailed formation method of the first insulating layer 210 can be referred to the relevant descriptions of below embodiments (about the manufacturing method of the display substrate), which is not repeated here.

For example, in at least one embodiment of the present disclosure, as illustrated in FIG. 2, the display substrate can further comprise a second insulating layer 320 disposed on the base substrate 100, and the second insulating layer can cover the first signal line 210 and the first insulating layer 310. In this way, compared to the display substrate illustrated in FIG. 1, in a case the display substrate is formed with the insulating layer 300 (which for example can comprise the first insulating layer 310 and the second insulating layer 320), the surface flatness level of the layer structure (e.g., a first electrode 500, an alignment layer 600 etc.) of the display substrate can be improved.

For example, in at least one embodiment of the present disclosure, as illustrated in FIG. 2, the display substrate can further comprise the first electrode 500 which is disposed on a side of the second insulating layer 320 away from the base substrate 100. For example, the first electrode 500 can be a pixel electrode and/or a common electrode. The flatness level of the surface of the second insulating layer 320 away from the base substrate 100 is improved. Compared to the display substrate illustrated in FIG. 1, the flatness level of the display area B to which the first electrode 500 corresponds can be also improved.

For example, in at least one embodiment of the present disclosure, as illustrated in FIG. 2, the display substrate can further comprise the alignment layer 600 which is disposed on the second insulating layer 320. The flatness level of the surface of the alignment layer 600 away from the base substrate 100 is improved. Compared to the display substrate illustrated in FIG. 1, the flatness level of the alignment layer 600 in the display area B is also improved, that is, the orientation and strengthen of the alignment layer 600 in the display area B are distributed evenly, and the liquid crystal molecules in the display area B can realize the state of synchronistical rotation in operation. For example, the alignment layer 600 can be a polyimide layer and has been treated with a rubbing process.

It should be noted that the display substrate is not limited to alleviate the display defectives in the liquid crystal display field. For example, the display substrate can be an organic light-emitting diode display substrate, and parameters such as the flatness level of the organic light-emitting layer of an organic light-emitting device can directly influence performance of the organic light-emitting device. The display substrate can allow the layer structures of the display substrate to be planarized, reduce the step, and accordingly improve the flatness level of the layers such as the organic light-emitting layer so as to improve the performance of the organic light-emitting device.

For example, in at least one embodiment of the present disclosure, the signal lines 200 can comprise at least one or a combination of a gate line, a data line and a common electrode line. For example, as illustrated in FIG. 2, in at least one embodiment of the present disclosure, the signal lines 200 comprise a first signal line 210 and a second signal line 220, the first signal line 210 can be a common electrode line, and the second signal line 220 can be a data line. In embodiments of the present disclosure, the type(s) of the signal lines 200 are not limited, as long as the provision of the signal lines 200 may result in a step or steps on the surface of the display substrate.

Descriptions about the technical solutions of the below embodiments of the present disclosure are given below by taking the case that the first signal line 210 is a common electrode line and the second signal line 220 is a data line for example.

For example, in at least one embodiment of the present disclosure, the display substrate can be an array substrate or other substrate. For example, the display substrate can be a touch substrate formed with touch electrodes and wires or the like. In an embodiment of the present disclosure, the type of the display substrate is not limited. Descriptions about the technical solutions of the below embodiments of the present disclosure are given below by taking an array substrate as an example of the display substrate.

For example, in at least one embodiment of the present disclosure, as illustrated in FIG. 2, the display substrate can be an array substrate, and a plurality of thin film transistors can be disposed in the array substrate. For example, in embodiments of the present disclosure, the display substrate can further comprise an active layer disposed on a side of the second insulating layer 320 away from the base substrate 100. For example, in an embodiment of the present disclosure, the common electrode line 210 can be disposed in a same layer and made of a same material as the gate electrode of a thin film transistor (e.g., the common electrode line and the gate electrode can be formed by patterning a same conductive material layer), and the first insulating layer 310 and/or the second insulating layer 320 can be disposed in a same layer and made of a same material as the gate insulating layer of the thin film transistor. For example, in an embodiment of the present disclosure, the second signal line 220 can be a data line, and the data line 220 can be disposed in a same layer and made of a same material as the source electrode or the drain electrode of the thin film transistor. An interlayer dielectric layer 400 can be disposed between the first electrode 500 and the data line 220.

In order to further improve the surface flatness level of the display substrate, an insulating layer can be disposed in each layer that the signal lines 200 are disposed in the display substrate, so as to match the signal lines 200. The relationship between the insulating layers and the signal lines 200 can be referred to the relationship between the first signal line 210 and the first insulating layer 310 as illustrated in FIG. 2, which is not repeated here.

Figure 3A:
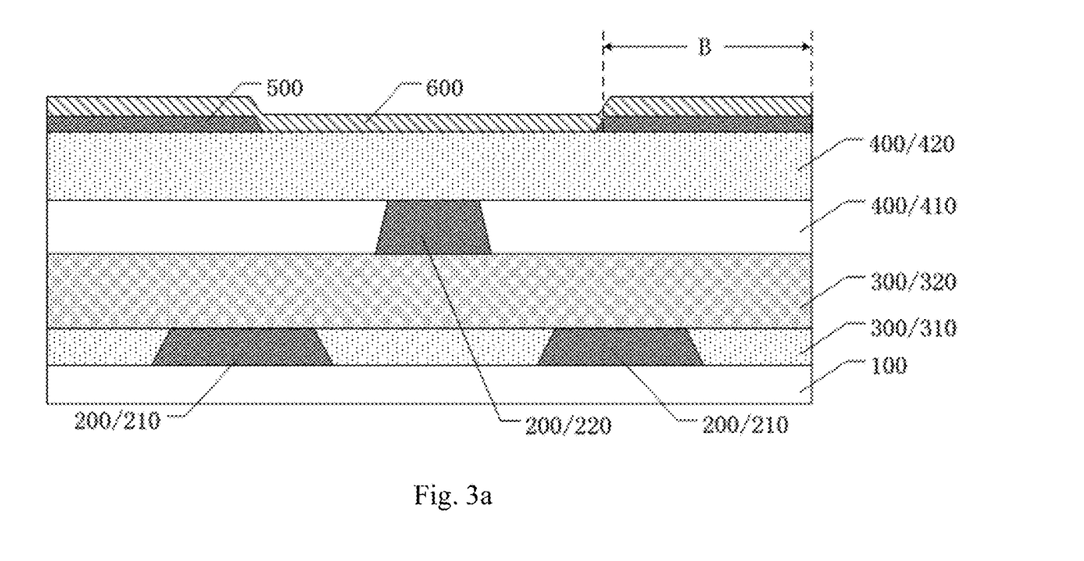
FIG. 3a is another schematically structural diagram of a display substrate provided by an embodiment of the present disclosure.

FIG. 3a is another schematically structural diagram of a display substrate provided by an embodiment of the present disclosure. For example, as illustrated in FIG. 3a, in an example of the embodiments of the present disclosure, in the layer that the second signal line 220 is disposed, a first interlayer dielectric layer 410 can be disposed, and the first interlayer dielectric layer 410 is matched with the second signal line 220, that is, the surface of the first interlayer dielectric layer 410 away from the base substrate 110 and the surface of the second signal line 220 away from the base substrate are substantially located in a continuous flat plane. Compared to the display substrate of the embodiment illustrated in FIG. 2, the surface flatness level of the display substrate illustrated in FIG. 3a is further improved.

Figure 3B:
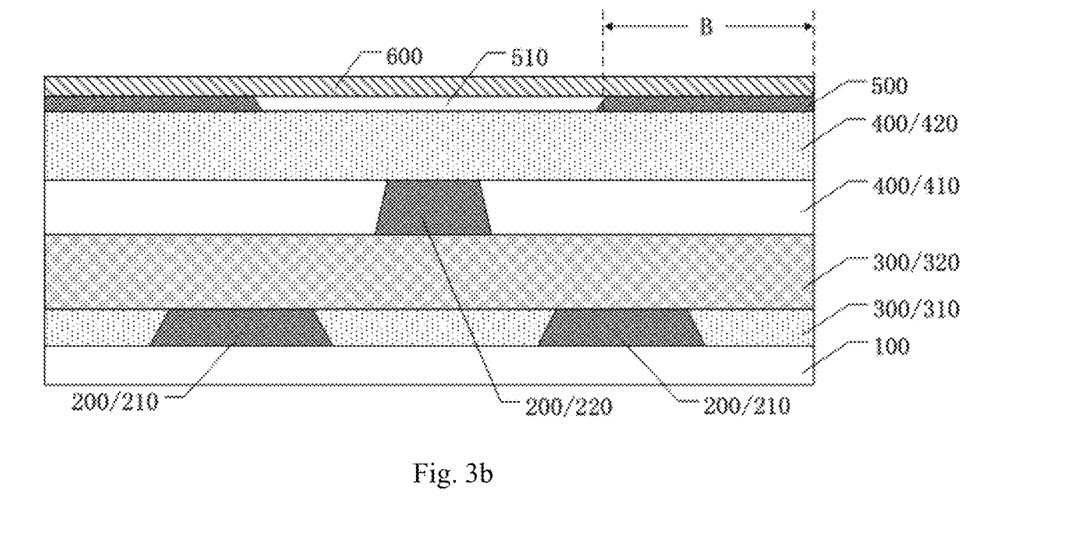
FIG. 3b is still another schematically structural diagram of a display substrate provided by an embodiment of the present disclosure.

It should be noted that, in embodiments of the present disclosure, the insulating layer is not limited to being disposed to match the signal line in the layer where the signal layer is located, and can also be disposed to match any other structure layer that causes an unevenness on the surface of the display substrate, so as to further improve the surface flatness level of the display substrate. FIG. 3b is still another schematically structural diagram of a display substrate provided by an embodiment of the present disclosure. For example, as illustrated in FIG. 3b, in an example of the embodiment of the present disclosure, in the layer where the first electrode 500 is disposed, a third insulating layer 510 can be disposed to match the first electrode 500, so as to allow the surface of the first electrode 500 away from the base substrate 100 and the surface of the second insulating layer 510 away from the base substrate 100 to be substantially located in a continuous flat plane. Compared to the display substrate of the embodiment illustrated in FIG. 3a, the surface flatness level of the display substrate illustrated in FIG. 3b is further improved.

Figure 4:
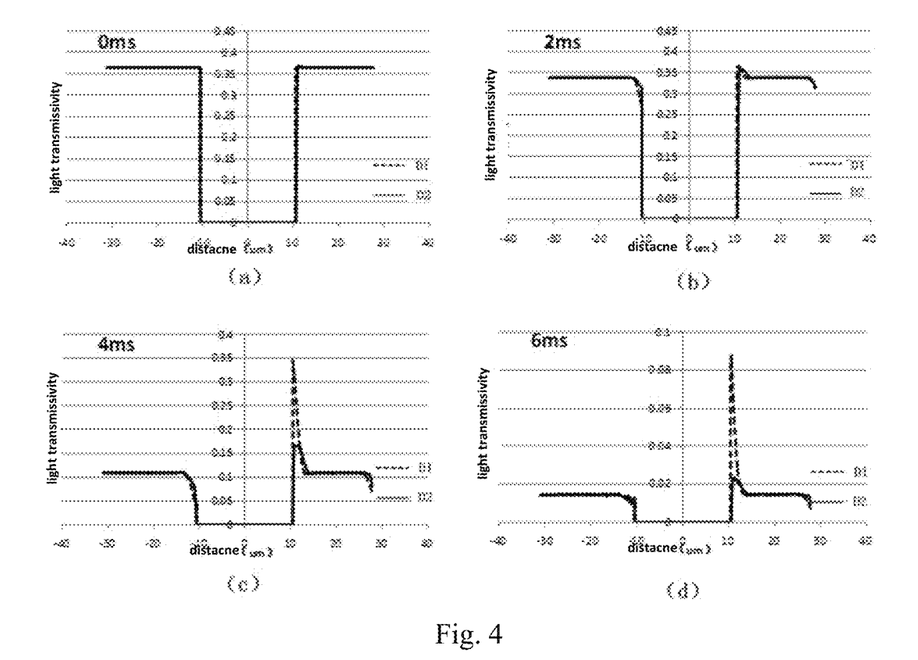
FIG. 4 is a simulation graph of the light transmissivity of a display substrate provided by an embodiment of the present disclosure.

In at least one embodiment of the present disclosure, a software simulation is performed to prove that the display defective such as residual image are alleviated in the display substrate in the above embodiment, and FIG. 4 is a simulation graph of the light transmissivity of a display substrate provided by an embodiment of the present disclosure. In the embodiment of the present disclosure, simulations are performed with the display substrate of the above embodiment through the software Techwiz 3D. Taking the center of the second signal line 200 as an origin, and taking the plane where the base substrate 100 is disposed as the horizontal plane, the horizontal coordinate represents a distance away from the origin in the horizontal plane, and the vertical coordinate represents light transmissivity. Moreover, in the embodiment of the present disclosure, the portion of the display substrate corresponding to the positive direction of horizontal axis is considered to be an area with serious light leakage, and the portion of the display substrate corresponding to the negative direction of the horizontal axis is not considered (i.e., considered to be without a step on the surface). The horizontal coordinate of 0 μm corresponds to the position of an edge of the second signal line 220, and D1 represents the simulation result of the display substrate illustrated in FIG. 1, and D2 represents the simulation result of the display substrates provided by the embodiment of the present disclosure.

As illustrated in FIG. 4, in the case of being applied with a same voltage, during the process from 0 ms to 6 ms, the light transmissivity in D2 declines faster than the light transmissivity in D1 obviously.

Figure 5:
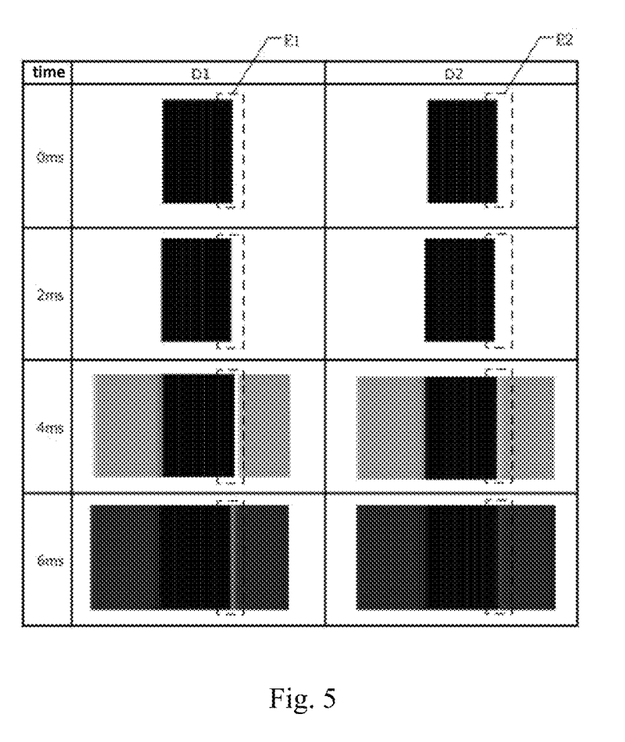
FIG. 5 is a simulation view of the light transmissivity of a display substrate provided by an embodiment of the present disclosure.

FIG. 5 is simulation view of the light transmissivity of a display substrate provided by an embodiment of the present disclosure. E1 represents a light leakage area in D1, and E2 represents a light leakage area in D2. In a time period of 2 ms to 6 ms, as can be seen from FIG. 5, the light transmissivity in D2 declines faster than the light transmissivity in D1 obviously.

Table 1 illustrates the change of the light transmissivity with time at the position in D1 and D2 of the horizontal coordinate of 10.8978.

TABLE 1

| Time | D1 | D2 |
|------|----|----|
| 0 ms | 0.364642 | 0.365618 |
| 2 ms | 0.363574 | 0.354803 |
| 4 ms | 0.31212 | 0.165622 |
| 6 ms | 0.066362 | 0.022991 |

As illustrated in Table 1, in the process from 2 ms to 4 ms, the light transmissivity in D1 declines from 0.363574 to 0.31212 and declines by 0.051454, and the light transmissivity in D2 declines from 0.354803 to 0.31212 and declines by 0.189181. In the time period of 2 ms to 4 ms, the descent range of the light transmissivity in D2 is larger than the descent range of the light transmissivity in D1, that is, the light transmissivity in D2 declines faster.

As can be proved in FIG. 4, FIG. 5 and Table 1, defectives such as residual image of the display substrate provided by the embodiment of the present disclosure can be alleviated by improving the surface flatness level of the display substrate. In addition, the higher the surface flatness level of the display substrate is, the better the effect of alleviating defectives such as residual image is.

At least one embodiment of the present disclosure provides a display panel and the display panel can comprise the display substrate of any one embodiment mentioned above.

For example, in an example of the embodiment of the present disclosure, the display panel can be a crystal liquid display panel can comprise an array substrate and an opposing substrate, which are disposed opposite to each other to form a liquid crystal cell. The liquid crystal cell is filled with a liquid crystal material. The opposed substrate can be for example a color filter substrate. The pixel electrode of each pixel unit of the array substrate is configured to impose an electric field to control the rotating degree of the liquid crystal material so as to realize the display.

For example, in another example of the embodiment of the present disclosure, the display panel can be an organic light-emitting diode (OLED) display panel. The array substrate of display panel can be formed with a stacked structure of organic light-emitting functional layers, and the cathode or the anode of each pixel unit is configured to drive the organic light-emitting material to emit light so as to realize display.

For example, in still another example of embodiments of the present disclosure, the display panel can be an e-paper display panel, in which the array substrate of the display panel is formed with an electronic ink layer, and the pixel electrode of each pixel unit of the array substrate is configured to impose a voltage to drive the charged micro particles in the electronic ink to move so as to realize display.

At least one embodiment of the present disclosure provides a display device, and the display device can comprise the display panel provided by any one embodiment mentioned above. For example, in an example of the embodiment of the present disclosure, the display device can be any product or component having display functions, such as a cellphone, a tablet computer, a television, a display device, a laptop, a digital photo frame, a navigator or the like.

At least one embodiment of the present disclosure provides a manufacturing method of display substrate, and the manufacturing method comprises: providing a base substrate; forming at least one first signal line on the base substrate; and forming a first insulating layer on the base substrate and the first insulating layer is disposed side by side with the at least one first signal line; a surface of the first insulating layer away from the base substrate and a surface of the at least one first signal line away from the base substrate are parallel with the base substrate and are substantially located in a continuous flat plane It should be noted that the detailed structure of the display substrate manufactured by the manufacturing method provided by embodiments of the present disclosure can be referred to the relevant descriptions in the aforesaid embodiments (about the thin display substrate), which is not repeated here.

FIGS. 6a-6i, FIGS. 7a-7d and FIG. 8 to FIG. 13 are process drawings of a manufacturing method of a display substrate provided by an embodiment of the present disclosure. Taking forming the display substrate as illustrated in FIG. 3a for example, as illustrated in FIGS. 6a-6i, FIGS. 7a-7d and FIG. 8 to FIG. 13, in at least one embodiment of the present disclosure, the manufacturing method of the display substrate provided by at least one embodiment of the present disclosure can comprise the following steps.

Figure 6A:
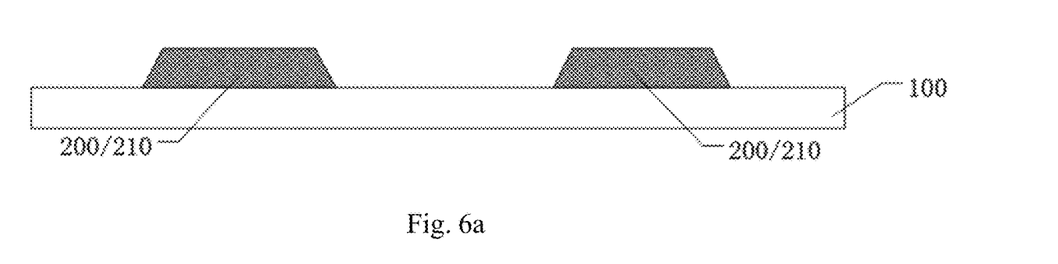
FIGS. 6a-6i, FIGS. 7a-7d and FIG. 8 to FIG. 13 are process drawings of a manufacturing method of a display substrate provided by an embodiment of the present disclosure.

As illustrated in FIG. 6a, a base substrate 100 is provided, a conductive layer film is deposited on the base substrate 100 and a patterning process is performed to the conductive layer film to form a first signal line 210.

In the embodiment of the present disclosure, the type of a material of the first signal line 210 is not limited. For example, the material of the signal line 210 can comprise copper-based metals, such as copper (Cu), copper molybdenum alloy (Cu/Mo), copper titanium alloy (Cu/Ti), copper molybdenum titanium alloy (Cu/Mo/Ti), copper molybdenum tungsten alloy (Cu/Mo/W), copper molybdenum niobium (Cu/Mo/Nb) and the like. The material of the first signal line 210 can also comprise chromium-based alloy materials such as chromium molybdenum alloy (Cr/Mo), chromium titanium alloy (Cr/Ti), chromium molybdenum titanium alloy (Cr/Mo/Ti) and the like. The material of the gate electrode 200 can also comprise aluminum or aluminum alloys or the like.

In at least one embodiment of the present disclosure, the patterning process can be a lithography patterning process for example, which can for example comprises: coating a photoresist layer on the structure layer to be patterned, applying a mask to expose the photoresist layer, developing the exposed photoresist layer to obtain a photoresist pattern, using the photoresist pattern as a mask to etch the structure layer, and removing the photoresist pattern optionally.

FIG. 6b to FIG. 6f are process drawings that illustrate forming the first signal line 210 on the base substrate 100 of in FIG. 6a. As illustrated in FIG. 6b to FIG. 6f, in an example of the embodiment of the present disclosure, forming the first signal line 210 on the base substrate 100 can comprise the following steps.

Figure 6B:
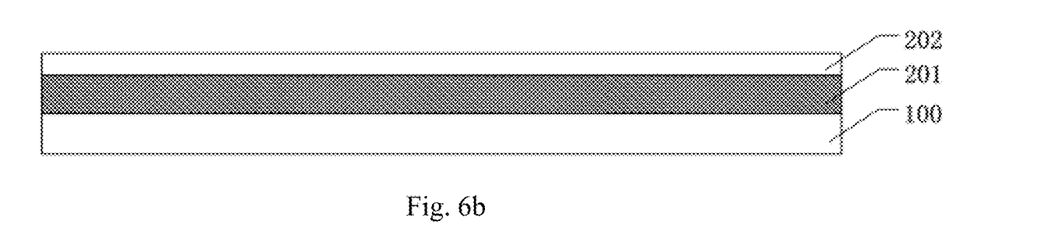

As illustrated in FIG. 6b, a base substrate 100 is provided, a conductive layer (the first signal line) film 201 is deposited on the base substrate 100 and a first photoresist layer 202 is coated on the conductive layer film 201.

Figure 6C:
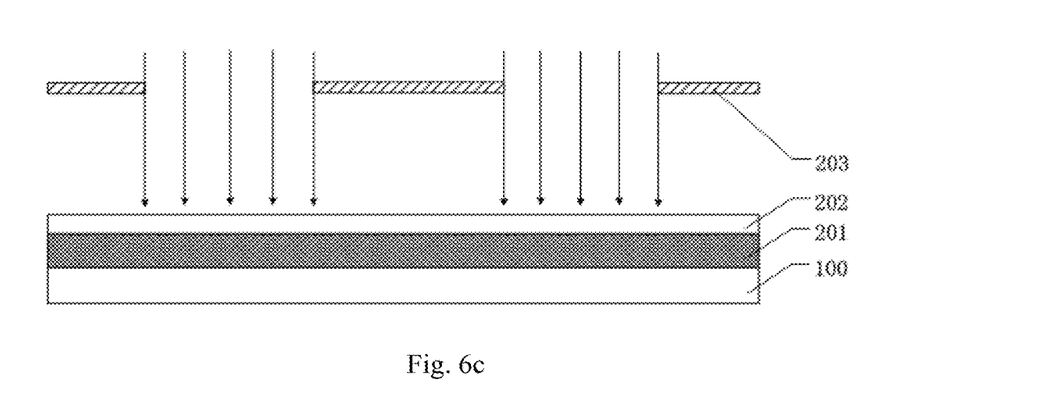

As illustrated in FIG. 6c, a first mask 203 is provided, and the first photoresist layer 202 is exposed using a first mask 203.

Figure 6D:
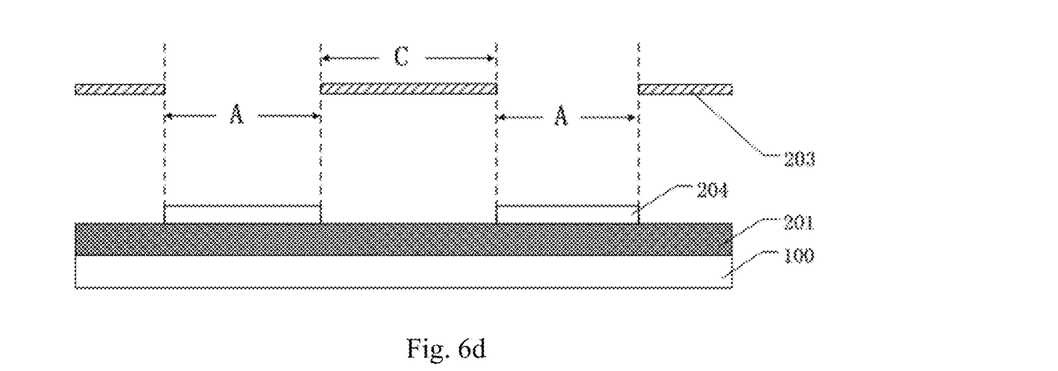

As illustrated in FIG. 6d, the exposed first photoresist layer 202 is developed to obtain a first photoresist pattern 204.

Figure 6E:
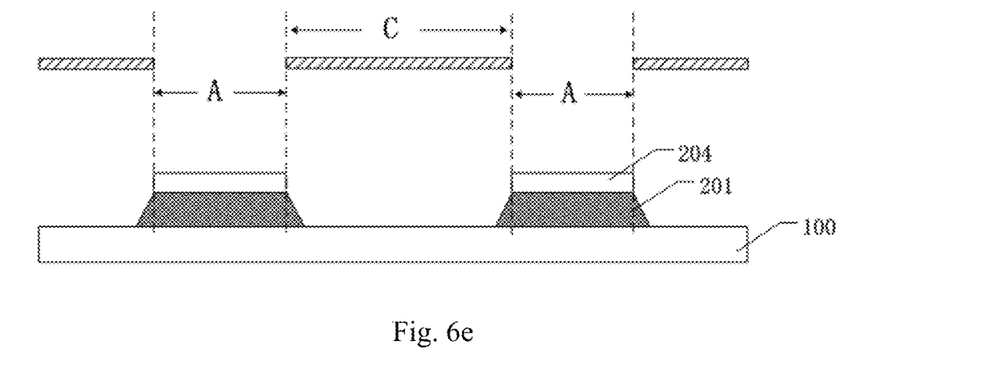

As illustrated in FIG. 6e, the conductive layer film 201 is etched using the first photoresist pattern 204 to form at least one first signal line 210.

Figure 6F:
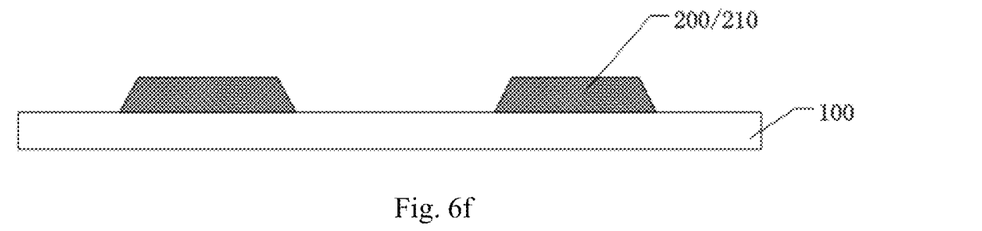

As illustrated in FIG. 6f, the first photoresist pattern on the first signal line 210 is removed.

It should be noted that in the forming process of the first signal line 210 as illustrated in FIG. 6b to FIG. 6f, the material of the first photoresist layer 202 is a negative photoresist, and a transparent area A of the first mask 203 corresponds to the location of the first signal line 210. However, the first photoresist layer 202 can also be a positive photoresist, and an opaque area of the mask for exposure corresponds to the location of first signal line 210. The portion of the positive photoresist that is exposed becomes resolvable after being exposed, and is removed after being developed, and the portion that is not exposed if formed as the photoresist pattern. Contrarily, after the exposure process, the portion of the negative photoresist that is not exposed becomes resolvable and is removed after being developed, and the portion that is exposed is formed as the photoresist pattern.

Figure 6G:
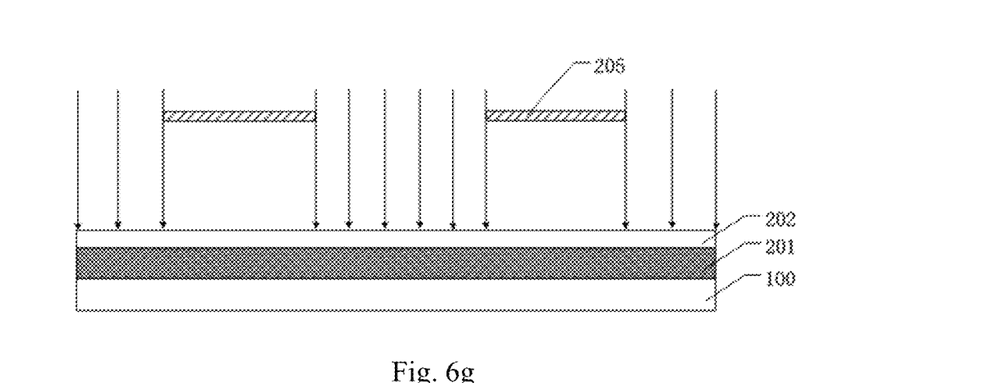
Figure 6H:
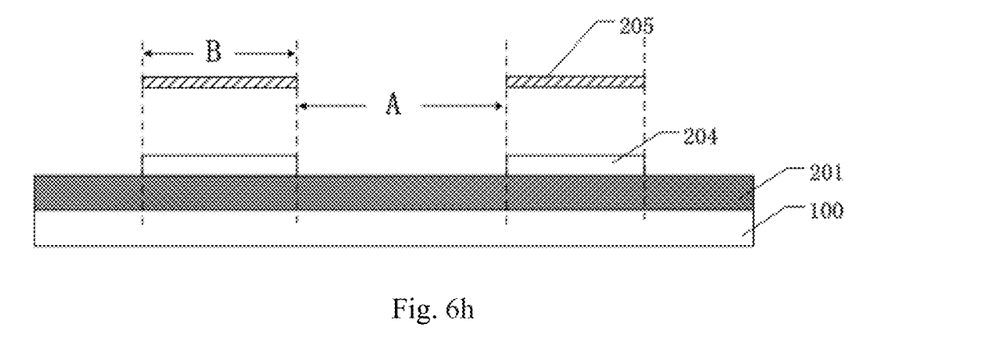
Figure 6I:
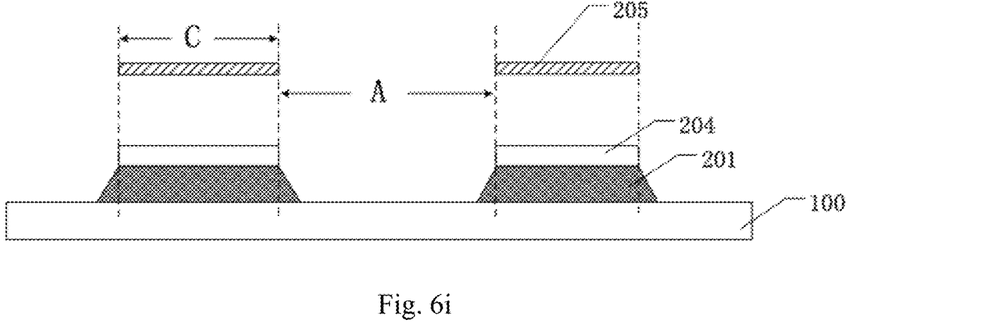

FIG. 6g to FIG. 6i are process drawings that illustrate forming the first signal line 210 on the base substrate 100 according to another example of the embodiments of the present disclosure. As illustrated in FIG. 6g to FIG. 6i, after formation of the conductive layer (the first signal line) film 201 and the first photoresist layer 202 on the base substrate 100, the first photoresist layer 202 is exposed using a second mask 205, and an opaque area C of the first mask 203 corresponds to the location of the first signal line 210. After exposing the first photoresist layer 202, the process for forming the first signal line 210 on the base substrate 100 can be referred to the relevant descriptions in the above embodiment as illustrated in FIG. 6d to FIG. 6f, which is not repeated here. For example, in this example, the first photoresist layer 202 is a positive photoresist.

The technical solutions of the below embodiments are described below by taking a negative photoresist as an example of the material of the first photoresist layer 202.

Figure 7A:
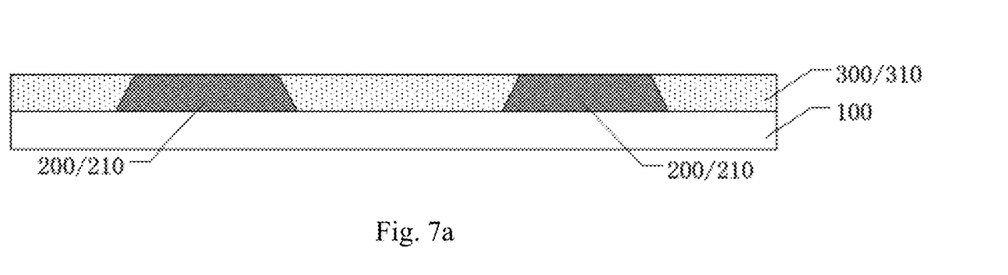

As illustrated in FIG. 7a, a first insulating layer film is formed on the base substrate 100, with a thickness substantially same as the thickness of the first signal line 210, and a patterning process is formed to the first insulating layer film to form a first insulating layer 310.

Figure 7B:
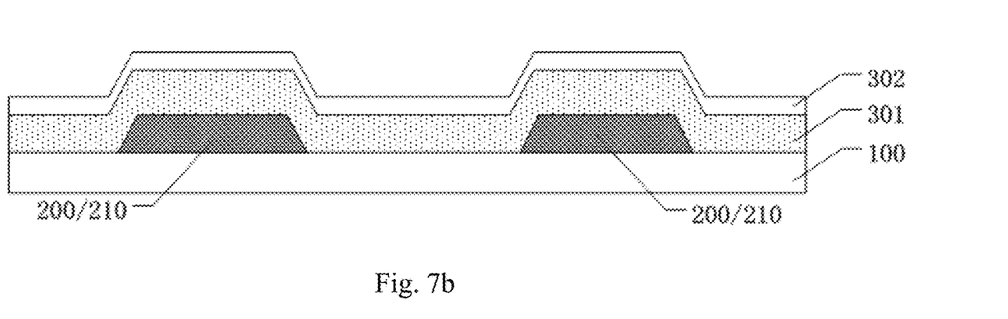
Figure 7C:
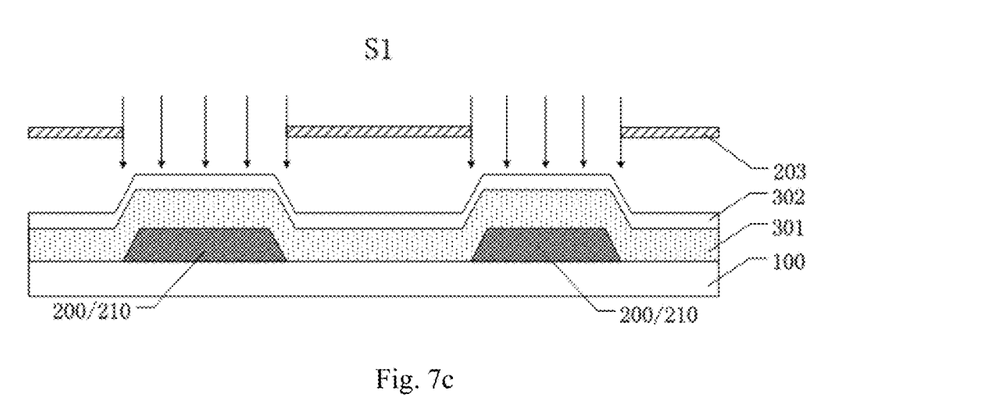

FIG. 7b to FIG. 7c are process drawings that illustrate forming the first insulating layer 310 on the base substrate 100 of in FIG. 7a. As illustrated in FIG. 7b to FIG. 7c, in an example of embodiments of the present disclosure, forming the first insulating layer 310 on the base substrate 100 can comprise the following steps.

As illustrated in FIG. 7b, the first insulating layer film 301 is formed on the base substrate 100 formed with the first signal line 210, with a thickness substantially same as the thickness of the first signal line 210, and then a second photoresist layer 302 is coated on the first insulating layer film 301. In a direction perpendicular to the base substrate 100, the thickness of the first insulating layer film 301 is substantially same as the thickness of the first signal line 210. Here, "substantially same" means for example the difference of the two layers is within a range of ±10%, and within a range of ±5% preferably.

As illustrated in FIG. 7c, at the side of the second photoresist layer 302 away from the base substrate 100 (e.g. the position S1 of FIG. 7c), the second photoresist layer 302 is exposed using the first mask 203, and the second photoresist layer 302 here can be for example a positive photoresist. The exposed second photoresist layer 302 is developed to obtain a second photoresist pattern. The first insulating layer film 301 is patterned using the second photoresist pattern to form the first insulating layer 310 as illustrated in FIG. 7a. It should be understood that the process for forming the display substrate illustrated in FIG. 7a by treating the display substrate illustrated in FIG. 7c can be referred to the relevant descriptions in the above embodiment as illustrated in FIG. 6c to FIG. 6f for forming the first signal line 210, which is not repeated here.

For example, in the embodiment of the present disclosure, in a case that the first insulating layer 310 is formed using the first mask 203, the properties of the first photoresist layer 202 and the second photoresist layer 302 are opposite. For example, if the first photoresist layer 202 is a positive photoresist, the second photoresist layer 302 is a negative photoresist; if the first photoresist layer 202 is a negative photoresist, the second photoresist layer 302 is a positive photoresist.

It should be noted that in an actual process, due to the limitation because of the precision of the equipment, the contact portion between the first signal line 210 and the first insulating layer 310 may be not in a strictly flat state and may have minor concave or convex. However, compared to the structure of the conventional display substrate, the surface flatness level of display substrates in embodiments of the present disclosure is still obviously improved, and the unevenness (e.g., a step) in the contact portion between the first signal line 210 and the first insulating layer 310 caused by the above reason is very small, so the unevenness can be ignored. In embodiments of the present disclosure, the technical solutions of embodiments of the present disclosure are described below taking the case that the contact portion of the first signal line 210 and the first insulating layer 310 has a continuous flat surface as an example.

The way by which the first insulating layer 310 is formed on the base substrate 100 is not limited to the above mentioned methods. For example, in another example of the embodiment of the present disclosure, the first insulating layer 310 that matches the first signal line 210 can be formed on the base substrate 100 without the first mask 203.

Figure 7D:
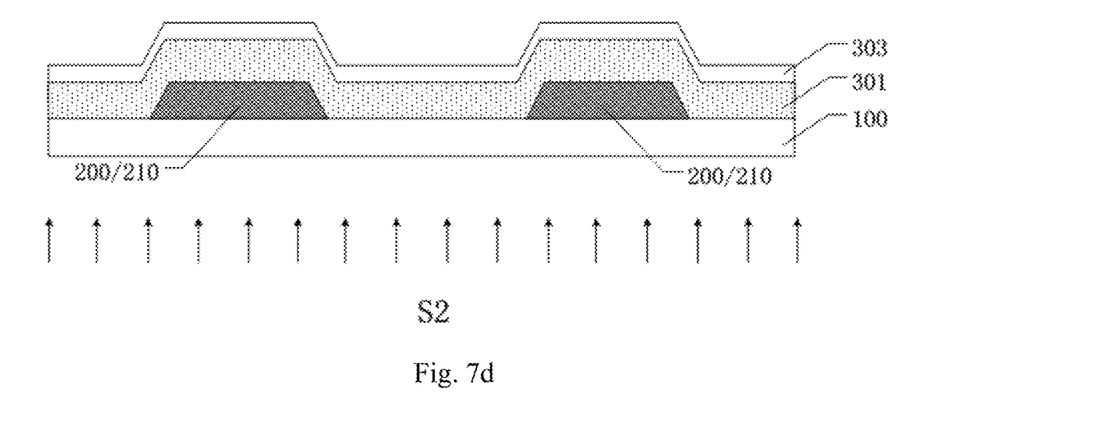

FIG. 7b and FIG. 7d are process drawings that illustrate forming the first insulating layer 310 on the base substrate 100. As illustrated in FIG. 7b and FIG. 7d, in another example of the embodiment of the present disclosure, forming the first insulating layer 310 on the base substrate 100 can comprise the following steps.

As illustrated in FIG. 7b, the first insulating layer film 301 is formed on the base substrate 100 formed with the first signal line 210, with a thickness substantially same as the thickness of the first signal line 210, and then a third photoresist layer 303 is coated on the first insulating layer film 301; in the direction perpendicular to the base substrate 100, the thickness of the first insulating layer film 301 is substantially same as the thickness of the first signal line 210.

As illustrated in FIG. 7d, from the side of the base substrate 100 away from the first signal line 210 (e.g., the position S2 of FIG. 7d), the third photoresist layer 303 is exposed by taking the first signal line 210 as a mask. The exposed third photoresist layer 303 is developed to obtain a third photoresist pattern. The first insulating layer film 301 is patterned using the third photoresist pattern to form the first insulating layer 310.

It should be noted that in this example, the first signal line 210 can be of an opaque or semi-transparent material. After exposing the third photoresist layer 303, the process for forming the display substrate illustrated in FIG. 7a by treating the display substrate illustrated in FIG. 7d can be referred to the relevant descriptions in the above embodiment as illustrated in FIG. 6c to FIG. 6f for forming the first signal line 210, which is not repeated here.

For example, in embodiments of the present disclosure, in a case that the first insulating layer 310 is formed using the first signal line 210 as the mask, the third photoresist layer 303 is a negative photoresist layer.

Figure 8:
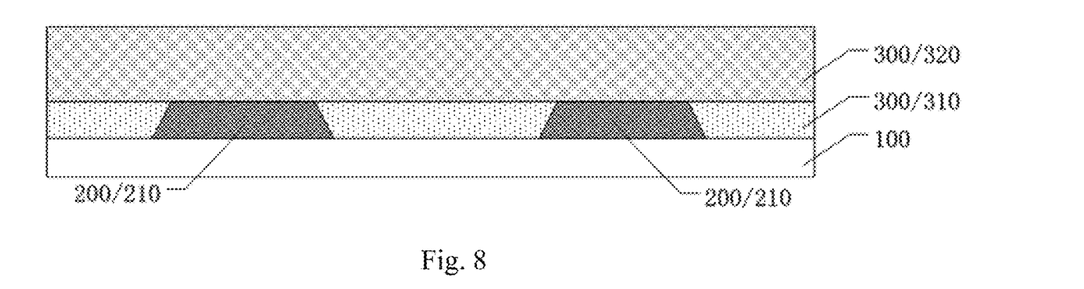

As illustrated in FIG. 8, the second insulating layer 320 is formed on the base substrate which is formed with the first signal lien 210 and the first insulating layer 310 thereon, and the second insulating layer 320 covers the first signal line 210 and the first insulating layer 310. Descriptions about the second insulating layer 320 can be referred to the relevant descriptions in embodiment one, which is not repeated here.

For example, in this example, the material of the first insulating layer 310 and/or the second insulating layer 320 can comprise silicon nitrides (SiNx), silicon oxides (SiOx), silicon oxynitrides (SiOxNy), aluminum oxide ($Al_2O_3$), aluminum nitride (AlN) or other suitable material. For example, the above mentioned first insulating layer 310 and/or the second insulating layer 320 can be deposited through methods such as a chemical vapor deposition (CVD).

Figure 9:
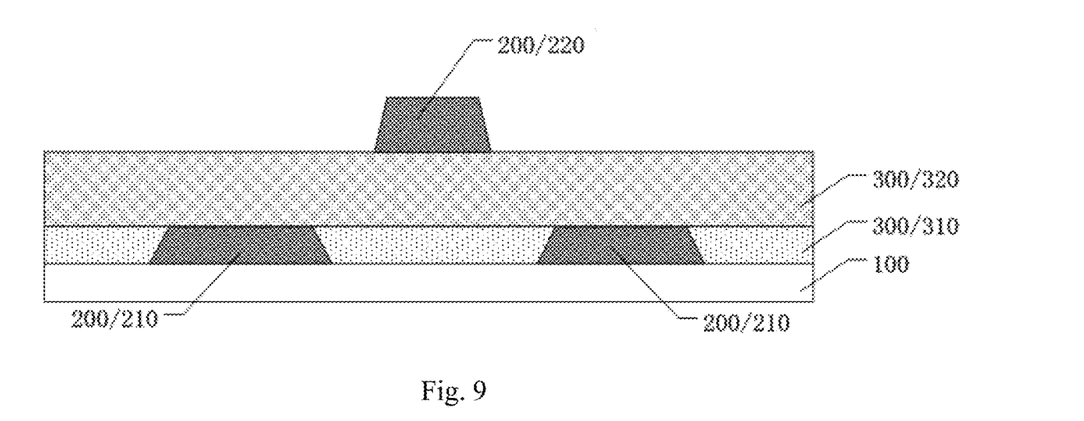

As illustrated in FIG. 9, a conductive layer film is deposited on the second insulating layer 320 and is patterned to form a second signal line 220. Descriptions about the second signal line 220 can be referred to the relevant descriptions in the above embodiment, which is not repeated here.

For example, in at least one embodiment of the present disclosure, the second signal line 220 can be a data line. The material for forming the second signal line 220 can comprise a metal material such as molybdenum, titanium, copper, chromium and the like; or an alloy material formed by the above mentioned metals, for example, copper-based alloy materials comprising copper molybdenum alloy (CuMo), copper titanium alloy (CuTi), copper molybdenum titanium alloy (CuMoTi), copper molybdenum tungsten alloy (CuMoW), copper molybdenum niobium (CuMoNb) and the like, or chromium-based alloy materials comprising chromium molybdenum alloy (CrMo), chromium titanium alloy (CTi), chromium molybdenum titanium alloy (CrMoTi) and the like.

Figure 10:
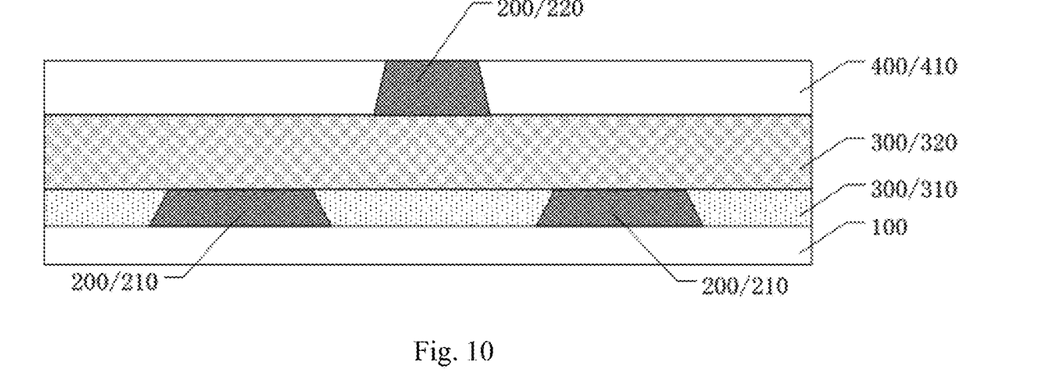

As illustrated in FIG. 10, an interlayer dielectric layer film is deposited on the base substrate, with a thickness substantially same as the thickness of the second signal line 220. A patterning process is performed to the interlayer dielectric layer film to form the first interlayer dielectric layer 410. Descriptions about the method of forming the first interlayer dielectric layer 410 can be referred to the relevant descriptions about forming the first insulating layer 410 as illustrated in FIG. 6b to FIG. 6f, which is not repeated here.

Figure 11:
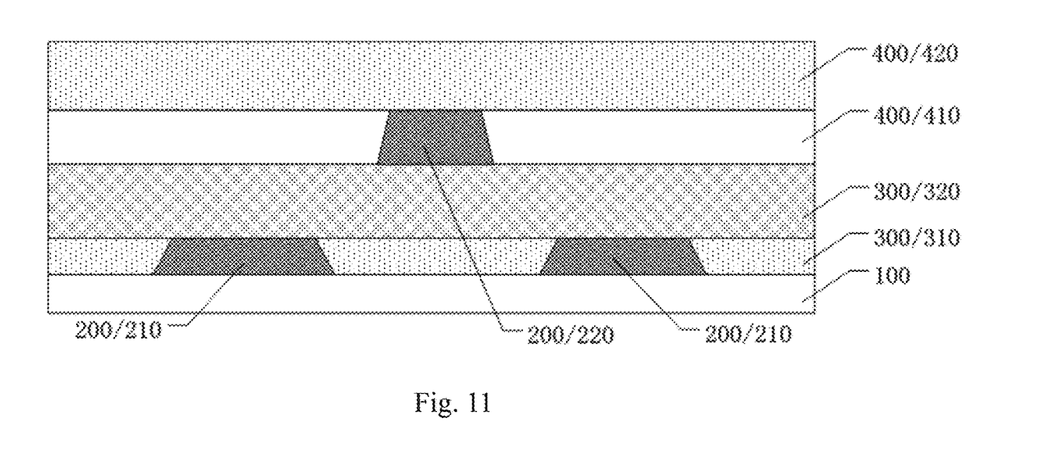

As illustrated in FIG. 11, the second interlayer dielectric layer 420 is formed on the first insulating layer 410 and the second signal line 220.

In the embodiments of the present disclosure, descriptions about the first insulating layer 410 and the second interlayer dielectric layer 420 can be referred to the relevant descriptions in the above embodiment, which is not repeated here. For example, in the embodiments of the present disclosure, the material for forming the interlayer dielectric layer 400 (which can comprise the first insulating layer 410 and the second interlayer dielectric layer 420 for example) can comprise inorganic insulating materials such as silicon nitride and silicon oxide, and can also be organic materials.

Figure 12:
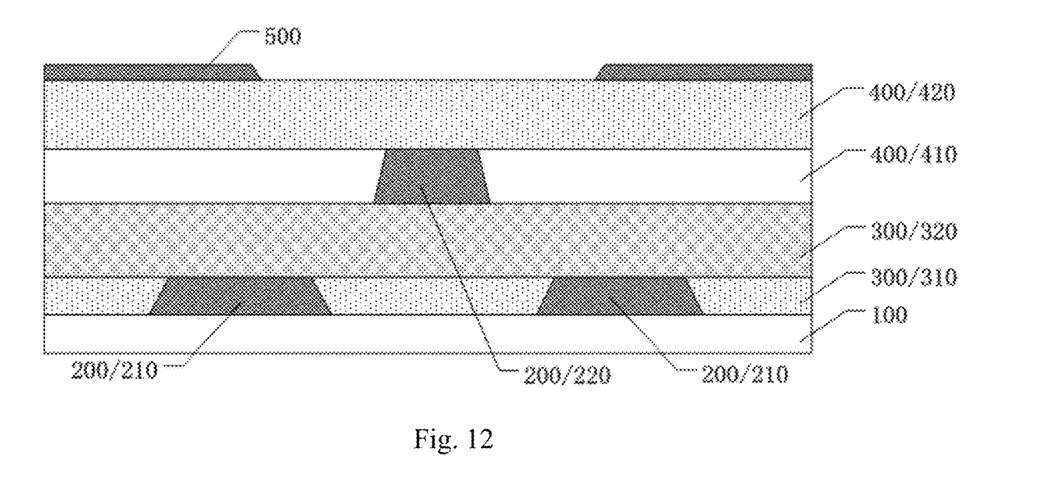

As illustrated in FIG. 12, a conductive layer film is deposited on the interlayer dielectric layer 400 and is patterned to form the first electrode 500.

For example, in an example of the embodiments of the present disclosure, the first electrode 500 can be a pixel electrode, and the material of the first electrode 500 can comprise indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), carbon nano tube and the like.

In another example of the embodiments of the present disclosure, the first electrode 500 can be an anode or a cathode of an organic light-emitting diode. In a case that the first electrode 500 functions as the anode, the material for forming the first electrode 500 can be a conductive material or a metal material. For example, the material for forming the first electrode 500 comprises indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), carbon nano tube and the like. In a case the first electrode 500 functions as the cathode, the material for forming the first electrode layer can be metals such as silver, aluminum, calcium, indium, lithium, magnesium and the like, or metal alloy of them (e.g. magnesium silver alloy) and the like.

Figure 13:
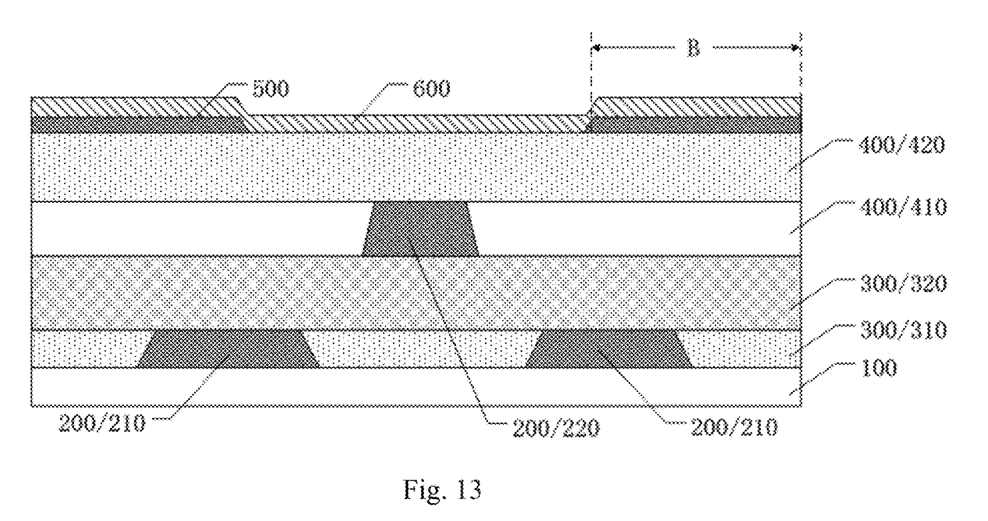

As illustrated in FIG. 13, in a case that the first electrode 500 is a pixel electrode, an alignment film 600 is formed. Descriptions about the alignment film 600 can be referred to the relevant descriptions in the embodiment, which is not repeated here.

Embodiments of the present disclosure provide a display substrate and a manufacturing method thereof, a display panel and a display device, which can have at least one of the following benefits.

(1) In the display substrate provided by at least one embodiment of the present disclosure, in the layer of the display substrate where a signal line is located, a first insulating layer is disposed side by side with the signal line so as to improve the surface flatness level of the display substrate and prevent the subsequently formed structures on the display substrate from defectives due to a too large step.

(2) In the display substrate provided by at least one embodiment of the present disclosure, the surface flatness level of the display substrate is improved so that the restriction to the thickness of the signal line is reduced or eliminated in design.

In the display substrate provided by at least one embodiment of the present disclosure, the planarization of the layers in the display substrate can reduce the number of slopes generated during the formation of the structures of layers and reduce the parasitic capacitance of the thin film transistor.

The following statements should be noted about the embodiments of the present disclosure.

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

(3) In case of no conflict, features in one embodiment or in different embodiments can be combined.

What are described above is related to the illustrative embodiments of the disclosure only and not limitative to the scope of the disclosure; the scopes of the disclosure are defined by the accompanying claims.

What is claimed is:

1. A display substrate, comprising:
   a base substrate; and
   at least one first signal line and a first insulating layer, which are disposed on the base substrate, wherein the at least one first signal line is a common electrode line and the first insulating layer is a gate insulating layer, wherein a surface of the first insulating layer away from the base substrate and a surface of the at least one first signal line away from the base substrate are parallel with the base substrate and are substantially located in a continuous flat plane.

2. The display substrate according to claim 1, further comprising:
   a second insulating layer disposed on the base substrate, wherein the second insulating layer covers the first signal line and the first insulating layer.

3. The display substrate according to claim 2, further comprising a first electrode or a semiconductor layer which is disposed on a side of the second insulating layer away from the base substrate.

4. The display substrate according to claim 1, wherein the display substrate is an array substrate.

5. A display panel, comprising the display substrate according to claim 1.

6. A display device, comprising the display panel according to claim 5.

7. The display substrate according to claim 2, wherein the display substrate is an array substrate.

8. A manufacturing method of a display substrate, comprising:
providing a base substrate;
forming at least one first signal line on the base substrate; and
forming a first insulating layer on the base substrate and the first insulating layer is disposed side by side with the at least one first signal line, wherein the at least one first signal line is a common electrode line and the first insulating layer is a gate insulating layer,
wherein a surface of the first insulating layer away from the base substrate and a surface of the at least one first signal line away from the base substrate are parallel with the base substrate and are substantially located in a continuous flat plane.

9. The manufacturing method according to claim 8, wherein forming the at least one first signal line on the base substrate comprises:
providing a first mask;
depositing a conductive layer film on the base substrate and coating a first photoresist layer on the conductive layer film; and
exposing the first photoresist layer with the first mask, developing the exposed first photoresist layer to obtain a first photoresist pattern, and patterning the conductive layer film with the first photoresist pattern so as to form the at least one first signal line.

10. The manufacturing method according to claim 9, wherein forming the first insulating layer on the base substrate and side by side with the at least one first signal line comprises:
in a direction perpendicular to the base substrate, depositing a first insulating layer film on the base substrate formed with the at least one first signal line, wherein a thickness of the first insulating layer film is substantially same as a thickness of the at least one first signal line;
coating a second photoresist layer on the first insulating layer film; and
on a side of the second photoresist layer away from the base substrate, exposing the second photoresist layer with the first mask, developing the exposed second photoresist layer to obtain a second photoresist pattern, and patterning the first insulating layer film with the second photoresist pattern so as to form the first insulating layer.

11. The manufacturing method according to claim 10, wherein
the first photoresist layer is a positive photoresist layer and the second photoresist layer is a negative photoresist layer; or
the first photoresist layer is a negative photoresist layer and the second photoresist layer is a positive photoresist layer.

12. The manufacturing method according to claim 9, wherein forming the first insulating layer on the base substrate and side by side with the at least one first signal line comprises:
in a direction perpendicular to the base substrate, depositing a first bate insulating layer film on the base substrate formed with the at least one first signal line, wherein a thickness of the first insulating layer film is substantially same as a thickness of the at least one first signal line;
forming a third photoresist layer on the first gate insulating layer film; and
on a side of the base substrate away from the at least one signal line, exposing the third photoresist layer by using the at least one signal line as a mask, developing the exposed third photoresist layer to obtain a third photoresist pattern, and patterning the first insulating layer film with the third photoresist pattern so as to form the first insulating layer.

13. The manufacturing method according to claim 12, wherein
the third photoresist layer is a negative photoresist layer.

14. The manufacturing method according to claim 8, further comprising:
forming a second insulating layer on the base substrate which is formed with the at least one first signal first line and the first insulating layer,
wherein the second insulating layer covers the at least one first signal line and the first insulating layer.

* * * * *